United States Patent
Knott et al.

(10) Patent No.: US 7,709,836 B2
(45) Date of Patent: May 4, 2010

(54) DETECTOR ARRANGEMENT, METHOD FOR THE DETECTION OF ELECTRICAL CHARGE CARRIERS AND USE OF AN ONO FIELD EFFECT TRANSISTOR FOR DETECTION OF AN ELECTRICAL CHARGE

(75) Inventors: Bernhard Knott, Neumarkt (DE); Georg Tempel, Dresden (DE)

(73) Assignee: Infineon Technologies AG, Munich (DE)

( * ) Notice: Subject to any disclaimer, the term of this patent is extended or adjusted under 35 U.S.C. 154(b) by 1366 days.

(21) Appl. No.: 10/507,787

(22) PCT Filed: Mar. 12, 2003

(86) PCT No.: PCT/DE03/00788

§ 371 (c)(1),
(2), (4) Date: May 9, 2005

(87) PCT Pub. No.: WO03/079454

PCT Pub. Date: Sep. 25, 2003

(65) Prior Publication Data

US 2006/0267122 A1 Nov. 30, 2006

(30) Foreign Application Priority Data

Mar. 14, 2002 (DE) ............................. 102 11 359

(51) Int. Cl.
*H01L 23/58* (2006.01)
*H01L 21/66* (2006.01)
(52) U.S. Cl. ............... 257/48; 257/429; 257/E21.522; 438/17
(58) Field of Classification Search ........... 257/48, 257/429, E21.522; 438/17; 365/185.08, 365/185.21
See application file for complete search history.

(56) References Cited

U.S. PATENT DOCUMENTS 5,457,336 A 10/1995 Fang et al.

(Continued)

FOREIGN PATENT DOCUMENTS

EP 1061580 A2 12/2000

(Continued)

OTHER PUBLICATIONS

English translation of Japanese Office Action dated Dec. 4, 2007—Notification of Reasons for Refusal.

(Continued)

*Primary Examiner*—M. Wilczewski
*Assistant Examiner*—Toniae M Thomas
(74) *Attorney, Agent, or Firm*—Brinks Hofer Gilson & Lione (57) ABSTRACT

The invention relates to a detector arrangement (100), a method for the detection of electrical charge carriers and use of an ONO field effect transistor for detection of an electrical charge. The detector arrangement (100) has an ONO field effect transistor embodied on and/or in a substrate (101), for the detection of electrical charge carriers, such that the electrical charge carrier (103) for detection may be introduced into die ONO field effect transistor layer sequence (102), a recording unit (104), coupled to the ONO field effect transistor, for recording an electrical signal characteristic of the amount and/or the charge carrier type for the electrical charge carrier (103) introduced into the ONO layer sequence (102) and an analytical unit for determining the amount and/or the charge carrier type of the electrical charge carrier (103) introduced into the ONO layer sequence (102) from the characteristic electrical signal.

9 Claims, 2 Drawing Sheets

U.S. PATENT DOCUMENTS

| | | | |
|---|---|---|---|
| 5,594,328 A | | 1/1997 | Lukaszek |
| 5,760,644 A | * | 6/1998 | Lancaster et al. ........... 327/566 |
| 5,768,192 A | | 6/1998 | Eitan |
| 6,441,397 B2 | | 8/2002 | Yamamoto |
| 6,807,101 B2 | * | 10/2004 | Ooishi et al. ........... 365/185.21 |

FOREIGN PATENT DOCUMENTS

| | | |
|---|---|---|
| JP | 64-69025 | 3/1989 |
| JP | 6-275591 | 9/1994 |
| JP | 10-284627 | 10/1998 |
| JP | 10-284726 | 10/1998 |
| JP | 2001-291753 | 10/2001 |
| JP | 2002-9179 | 1/2002 |

OTHER PUBLICATIONS

Wes Lukaszek, S. Reno and R. Bammi, "Influence of Photoresist on Wafer Charging During High Current Arsenic Implant," XI International Conference on Ion Implantation Technology, Jun. 16-21, 1996, Austin, TX.

Boaz Eitan, Paolo Pavan, Ilan Bloom, Efraim Aloni, Aviv Frommer, and David Finzi, "NROM: A Novel Localized Trapping, 2-Bit Nonvolatile Memory Cell," IEEE Electron Device Letters, vol. 21, No. 11, Nov. 2000.

* cited by examiner

DETECTOR ARRANGEMENT, METHOD FOR THE DETECTION OF ELECTRICAL CHARGE CARRIERS AND USE OF AN ONO FIELD EFFECT TRANSISTOR FOR DETECTION OF AN ELECTRICAL CHARGE

Detector arrangement method for the detection of electrical charge carriers and use of an ONO field effect transistor for detection of an electrical charge The invention relates to a detector arrangement, a method for the detection of electrical charge carriers and the use of an ONO field effect transistor for detection of an electrical charge.

An important standard method in semiconductor technology for the deposition of layers is the CVD method ("chemical vapor deposition"). The CVD method is a coating technology for forming a thin layer from the vapor phase on a solid substrate. The principle of the CVD method consists in gaseous starting materials being conducted over a substrate and being chemically decomposed into their constituents, as a result of which a new layer grows on the substrate surface. The starting materials, the so-called precursors, are usually decomposed thermally, that is to say by heating the substrate, and the deposition is effected with the involvement of a chemical reaction. By way of example, a volatile gaseous component reacts with another gas to form a solid material that is deposited on the substrate.

In order to achieve lower process temperatures than in the CVD method described above, use is often made of the plasma enhanced chemical vapor deposition method (PECVD). Whereas in the conventional CVD method the vapor phase reaction is initiated by thermal energy on account of the heating of the substrate, the PECVD method is based on converting a gas into the plasma state in the vicinity of the substrate surface. One of the reaction products is a solid substance that is deposited on the surface and thereby forms a new layer.

However, the PECVD method and other plasma-based methods (for example the plasma etching method) and also other methods in which electrically charged particles occur (for example ion beam etching) have the disadvantage that the electrically charged particles that are generated in the course of said method may occur with respect to an electrical charge of structure elements at or near the surface of a substrate that is to be processed by the respective method. This leads to damage to the components formed on or in the substrate.

One important standard component in integrated circuits is the field effect transistor. Parameters essential to the functionality of a field effect transistor are the length and the material of the gate insulating layer, which is often formed as a silicon dioxide layer on a substrate. The gate insulating layer has the functionality of electrically decoupling the gate electrode from the conducting channel between the two source/drain regions of the field effect transistor. If the gate insulating layer is subjected to a method step in the course of which free electrical charge carriers are generated, then said charge carriers may be deposited in the gate insulating layer and undesirably influence the insulation effect of the gate insulating layer. An impairment of the electrical insulation effect of the gate insulating layer on account of the action of electrically charged particles may lead to an impairment of the characteristic and the reliability of the field effect transistor and therefore of the entire integrated circuit.

In the case of a floating gate memory cell based on a field effect transistor, one disadvantageous consequence of damage to the gate insulating layer on account of an undesirable introduction of electrical charge carriers into the gate insulating layer is the loss of the charge previously introduced into a floating gate or a reduction of the retention time of the charge introduced into a floating gate. In the case of a floating gate memory cell, the information to be stored is coded in the form of a quantity of charge introduced in the floating gate layer. A dissipation of said quantity of charge on account of an electrical leakage current owing to a damaged gate insulating layer leads to the stored information being lost. Such an electrical leakage current ("stress-induced leakage current", SILC) is an example of a disadvantageous effect based on damage to a gate insulating layer.

The described damage to a gate insulating layer or another functional layer of an integrated component may arise for example if, during a plasma process, electrical charge carriers are accumulated on an uncovered area of a layer sequence and bring about an electrical current flow through the layer on account of a potential difference with respect to the substrate. This may result in damage to the gate insulating layer or in an electrical breakdown of the gate insulating layer.

In order to be able to counteract the problem area described, it is important to understand the processes during the formation of such damage and to quantify the damage associated with a specific experience.

The prior art discloses methods which make it possible to detect the damage to an integrated device component on account of undesirable electrical charging.

It is known, for the purpose of detecting the electrical charge of an electrically chargeable structure on account of a plasma process carried out previously, to provide capacitors having sufficiently large capacitor areas and to register the so-called Qbd value. The Qbd value denotes the total quantity of electrical charge at which the functionality of a capacitor with a silicon dioxide layer provided in between as a dielectric collapses. In other words, it can be deduced from the collapse of the functionality of a stacked capacitor that, in the course of the plasma process that brings about the application of the charge, a specific quantity of charge was exceeded on the capacitor areas.

Another known method for the detection of an electrical charge of an electrically chargeable structure on a substrate is based on the analysis of surface charges on a thick silicon dioxide layer (so-called "surface charge analysis").

[1] discloses the use of an arrangement of EEPROMs ("electrically erasable and programmable read only memory") as components for storing electrical charge carriers that are to be registered, and for registering a shift in the threshold voltage of the transistor of the EEPROM memory cell on account of the electrical charge carriers stored in the EEPROM memory cell.

A threshold voltage of a transistor is to be understood as the voltage that is at least to be applied between gate region and one of the source/drain regions and is necessary in order that a non-negligible electrical current flows between the two source/drain regions of the transistor.

In accordance with [1], a multiplicity of EEPROM memory cells are integrated into a wafer in matrix form, thereby forming a so-called "CHARM" wafer. Each of the EEPROM memory cells is coupled to a so-called "charge collection electrode" (CCE) for accumulating electrical charge carriers that are to be detected at the wafer surface. During the generation of electrical charge carriers (for example on account of a PECVD method to which the wafer is subjected), charge carriers that flow into the charge storage layer of the EEPROM memory cell coupled to the respective collection electrode are accumulated on the charge collection electrode. The threshold voltage of the transistor of the EEPROM memory cell is characteristically altered on account of the presence of electrical charge carriers in the charge storage layer of the EEPROM memory cell, this alteration being regarded as a measure of the quantity of electrical charge carriers obtained in the course of the plasma method. This yields an item of information with regard to the quantity of electrical charge carriers in the course of the plasma etching process.

It should be noted that the concept of the charge collection electrode (clearly an antenna structure) is also applied to other semiconductor components that are integrated in standard fashion.

In order to detect the electrical charge of an electrically chargeable structure on or in a substrate, in accordance with the prior art, the intensity of the gate leakage current ("stress induced leakage current") is furthermore registered, said leakage current being greater, the more electrical charge carriers are undesirably introduced in an associated gate insulating layer.

The known methods for the detection of an electrical charge of an electrically chargeable structure have a series of disadvantages. By way of example, the results obtained by means of test structures cannot readily be transferred to real wafers since the often specific arrangement and dimensioning of the components may have an influence on local differences during plasma processes. The formation of antenna structures on test structures represents an intervention in the charging operation and may therefore lead to artefacts. Furthermore, the spatial resolution of the charge of a substrate is impaired when using large-area antenna structures. A similar situation obtains for the above-described Qbd measurements on large-area capacitances. Furthermore, the methods known from the prior art, in particular the "CHARM" wafer, are complex and expensive in their fabrication.

Furthermore, it is known to use a field effect transistor with an ONO layer sequence as a gate insulating layer as a memory cell. A method for storing two bits in an ONO field effect transistor is described for example in [2].

[4] discloses a non-volatile memory structure with a protective structure for limiting process-induced damage that may occur during a fabrication method.

[5] discloses a programmable read only memory with a dielectric trapping layer into which electrical charge carriers can be introduced, which trapping layer is arranged between two silicon oxide layers.

[6] discloses an apparatus which detects the current density versus voltage characteristic of an integrated circuit processing equipment such as, for example, a plasma etcher.

[7] discloses a protective apparatus with a protection transistor and an antenna, which apparatus is active during a method for fabricating a semiconductor chip.

The invention is based on the problem of providing a detector arrangement for the detection of electrical charge carriers which can be used to register a charge phenomenon in a substrate with a tenable outlay and good spatial resolution.

The problem is solved by means of a detector arrangement, by means of a method for the detection of electrical charge carriers and by means of the use of an ONO field effect transistor for the detection of an electrical charge having the features in accordance with the independent patent claims.

The detector arrangement for the detection of electrical charge carriers has an ONO field effect transistor that is formed in or on a substrate and is set up in such a way that the electrical charge carriers to be detected can be introduced in the ONO layer sequence, and has a registering unit that is coupled to the ONO field effect transistor and is set up in such a way that it registers an electrical signal characteristic of the quantity and/or the charge carrier type of the electrical charge carriers introduced in the ONO layer sequence, and has a detector unit for the detection of the quantity and/or the charge carrier type of the electrical charge carriers introduced in the ONO layer sequence from the characteristic electrical signal.

In the case of a method for the detection of electrical charge carriers with a detector arrangement having the features described above, the substrate is subjected to a process step in which electrical charge carriers are introduced into the ONO layer sequences of the ONO field effect transistor, in which the electrical signal that is characteristic of the quantity and/or the charge carrier type of the electrical charge carriers introduced in the ONO layer sequence is registered by means of the registering unit, and in which the quantity and/or the charge carrier type of the electrical charge carriers introduced in the ONO layer sequence is detected from the characteristic electrical signal by means of the detector unit.

Furthermore, the invention uses an ONO field effect transistor for the detection of the electrical charge of an electrically chargeable structure on and/or in a substrate.

An ONO transistor is a field effect transistor in which the gate insulating layer is formed as a layer sequence referred to as an ONO layer sequence. An ONO layer sequence comprises a first silicon dioxide layer, a silicon nitride layer on the first silicon dioxide layer and a second silicon dioxide layer on the silicon nitride layer. An ONO layer sequence has the property, in particular, that electrical charge carriers injected in the silicon nitride layer remain permanently in the silicon nitride layer, thereby avoiding a dissipation of said electrical charge carriers through one of the two silicon dioxide layers (at any rate in the absence of a high electrical voltage) on account of the electrically insulating property of the ONO layer sequence.

In contrast to the field effect transistor in accordance with [2], the invention uses a field effect transistor with an ONO layer sequence for detecting electrical charge carriers that are generated for example in the course of a method step appertaining to semiconductor technology. If, by way of example, electrical charge carriers are generated during a method step appertaining to semiconductor technology (e.g. during a PECVD method), then said charge carriers, in the case of the detector arrangement according to the invention, can be introduced into the ONO layer sequence, more precisely can be introduced into the silicon nitride layer of the ONO layer sequence. This simulates the "stress" to which, by way of example, a gate insulating layer of a transistor of an integrated circuit is exposed during the method appertaining to semiconductor technology on account of the presence of electrical charge carriers. The physical processes underlying the introduction of such charge carriers into a gate insulating layer may be examined and quantified using the test structure according to the invention. Clearly, the electrical properties of the ONO field effect transistor, in particular the threshold voltage thereof, are altered on account of the introduction of the electrical charge carriers into the ONO layer, the sign and value of the shift being a measure of the charge carrier type of the electrical charge carriers of the charge carriers introduced into the ONO layer sequence and a measure of the quantity of the charge carriers introduced therein. It must be emphasized that the shift in the threshold voltage of the ONO field effect transistor is mentioned here only as an example of a possible characteristic electrical signal that can be registered in order to detect the electrical charge carriers in the ONO layer sequence. According to the invention, the registering unit of the detector arrangement is generally set up in such a way that it registers said characteristic electrical signal. The detector unit according to the invention detects, from said characteristic electrical signal, the quantity and/or the charge carrier type of the electrical charge carriers to be detected.

A basic idea of the invention may clearly be seen in the fact that an integrated field effect transistor is formed with an oxide-nitride-oxide layer sequence (ONO layer sequence) as gate insulating layer, that is to say with a layer sequence having a silicon nitride layer ($Si_3N_4$) between two silicon dioxide layers ($SiO_2$). An ONO layer sequence can locally store electrical charge carriers. The electrical charge carriers are localized in the electrically insulating silicon nitride layer of the ONO layer sequence. Electrical charge carriers are introduced into the ONO layer sequence generally by means of the tunneling of electrical charge carriers through one of the silicon dioxide layers on account of a sufficiently high energy of the charge carriers, for example on account of high potential differences between the terminals of the ONO transistor or on account of a high kinetic energy of the charge carriers. The presence of electrical charge carriers in the ONO layer influences the electrical properties of the transistor in a characteristic manner that can be registered. Such an alteration of the electrical properties of the ONO field effect transistor with a charged silicon nitride layer compared with an ONO field effect transistor whose silicon nitride layer is free of charge carriers can be registered for example by applying a constant source/drain voltage and registering the electrical source/drain current or the alteration thereof. If a predeterminable gate voltage is varied until a source/drain current no longer occurs, it is possible to register the threshold voltage of the ONO transistor or the shift thereof on account of the introduction of electrical charge carriers into the ONO layer sequence.

According to the invention, the electrical charge carriers to be detected (generated in the course of a plasma process, for example) are introduced into the silicon nitride layer from the gate region via the upper silicon dioxide layer of the ONO layer sequence. As a result, the electrical parameters of the field effect transistor are altered in a characteristic manner; in particular, the threshold voltage of the field effect transistor is altered since the introduced electrical charge carriers can clearly be interpreted as a gate voltage component since they characteristically alter the conductivity of the channel region of the ONO field effect transistor in a manner similar to an external electrical voltage that is actually applied to the gate region.

The detector arrangement according to the invention has a series of advantages over the arrangement for the detection of electrical charge carriers known from the prior art. By way of example, the detector arrangement according to the invention is cost-effective, in particular substantially more cost-effective than a "CHARM" wafer.

Furthermore, the detector arrangement according to the invention affords the advantage that it is used to detect an electrical charge of a real substrate (for example a wafer) or of component structures. The use of the detector arrangement according to the invention permits a direct comparison between different process installations.

The registered charge of an ONO layer sequence is effected during the processing of the substrate. By way of example, before carrying out a plasma process in order to form integrated components on a first surface region of the substrate, an ONO field effect transistor of the detector arrangement according to the invention may be formed on a second surface region of the substrate and the threshold voltage of said transistor may be registered. Integrated components may then be formed on the first surface region of the substrate using a plasma process. The "stress" that occurs during this process on account of generated electrical charge carriers can be registered by the alteration of the threshold voltage of the ONO field effect transistor being registered by means of the detector unit according to the invention.

The detector arrangement according to the invention is also not restricted to plasma and ion beam processes, but rather enables the quantification of any desired electrical charge of an electronic device on account of a process step.

The detector arrangement according to the invention can at least partially be formed as an integrated circuit. An ONO field effect transistor can therefore be formed with very small dimensions down into the nanometers range by means of mature methods appertaining to semiconductor technology. On account of this small structural dimension, it is possible to achieve a high spatial resolution in the detection of the charge phenomena.

Furthermore, it is possible to simulate a charge of an electrical layer on the basis of a charge of the ONO layer sequence of the detector arrangement of the invention on account of a sufficiently high voltage applied externally. It is therefore possible to calibrate the relationship between the quantity of electrical charge carriers to be detected and an alteration of an electrical signal, for example of a threshold voltage.

Furthermore, the detector arrangement according to the invention makes it possible to detect not only the quantity but also the charge carrier type (i.e. positively or negatively electrically charged charge carriers) of the electrical charge carriers introduced in the ONO layer sequence.

The ONO field effect transistor according to the invention may be configured as a field effect transistor of the n conduction type or p conduction type. Consequently, either electrons or holes may be the electrical charge carriers to be detected. It should be noted that in particular the layer thicknesses of the detector arrangement, further in particular the individual layer thicknesses of the ONO layer sequence, are preferably adapted to the sign of the charge carriers to be detected or are adapted to the fact of whether an n-FET or a p-FET is present. In other words, the thickness of the layer sequences is preferably set variably depending on the scenario of whether electrons or holes are present.

In accordance with a preferred refinement of the detector arrangement according to the invention, in order to detect the quantity and the charge carrier type of the electrical charge carriers introduced in the ONO layer sequence, the shift in the threshold voltage of the ONO field effect transistor is registered as the electrical signal that is characteristic thereof. The charge carrier type can be detected depending on whether the threshold voltage is shifted toward a higher or toward a lower threshold voltage. Depending on the sign of the electrical charge of the electrical charge carriers to be detected that are introduced in the silicon nitride layer of the ONO layer sequence, an electrical voltage applied externally to the gate region of the ONO field effect transistor is either amplified or attenuated, as a result of which the threshold voltage of the ONO field effect transistor is increased or decreased.

In accordance with a refinement of the method for the detection of electrical charge carriers, a PECVD method is applied to a wafer with the detector arrangement formed thereon and/or therein, as a result of which electrical charge carriers are introduced into the silicon nitride layer of the ONO layer sequence of the ONO field effect transistor of the detector arrangement on account of the plasma. As a result, the characteristic electrical signal representing the threshold voltage of the ONO field effect transistor is shifted, and this shift is registered in terms of magnitude and sign by means of the registering unit. The magnitude of the shift in the threshold voltage is characteristic of the quantity and the sign of the shift in the threshold voltage is characteristic of the charge carrier type of the electrical charge carriers introduced in the ONO layer sequence. In a further method step, the charge carrier type and the quantity of the electrical charge carriers introduced in the ONO layer sequence are detected from the sign and magnitude of the shift in the threshold voltage by means of the detector unit.

Preferred developments of the invention emerge from the dependent claims.

Preferred developments of the detector arrangement according to the invention are described below.

The registering unit of the detector arrangement according to the invention may have a first registering subunit that is coupled to the two source/drain regions of the ONO field effect transistor and is set up in such a way that it can be used to apply a first predeterminable voltage between the two source/drain regions of the ONO field effect transistor, and that it registers the intensity of an electrical current flow between the two source/drain regions.

In accordance with a further refinement of the registering unit, the latter has a second registering subunit that is coupled to the gate region of the ONO transistor and is set up in such a way that it can be used to apply a second predeterminable electrical voltage to the gate region of the ONO transistor.

Clearly, the registering unit having the first and second registering subunits can be used to register the dependence of the electrical source-drain current on the source-gate voltage. Clearly, a transistor characteristic curve can be recorded. In particular, the threshold voltage of the ONO field effect transistor or a shift in the threshold voltage can be registered.

In accordance with an advantageous refinement, the electrical signal that is registered by the registering unit and is characteristic of the quantity and/or the charge carrier type of the electrical charge carriers introduced in the ONO layer sequence may be an alteration of the threshold voltage of the ONO transistor on account of the introduction of electrical charge carriers into the ONO layer sequence.

Preferably, in the case of the ONO transistor of the detector arrangement, the two source/drain regions are formed as two doped surface regions of the substrate arranged at a distance from one another, the ONO layer sequence is formed from a first silicon dioxide layer on the substrate between the two source/drain regions, a silicon nitride layer on the first silicon dioxide layer and a second silicon dioxide layer on the silicon nitride layer, and the gate region is formed as an electrically conductive layer on the second silicon dioxide layer.

The substrate may be in particular a silicon substrate and further in particular a p-doped or an n-doped silicon substrate. If the substrate is a p-doped silicon substrate, then the two source/drain regions are n-doped, and if the substrate is an n-doped silicon substrate, then the two source/drain regions are p-doped regions. In other words, the ONO field effect transistor may be formed as a field effect transistor of the n conduction type or the p conduction type.

The detector arrangement may furthermore have a charge collection electrode that is coupled to the ONO layer sequence via the gate region and serves for accumulating electrical charge carriers to be detected.

The charge collection electrode (CCE) is clearly an antenna structure, preferably arranged at the surface of the detector arrangement, which can accumulate electrical charge carriers to be detected and, via the gate region of the ONO field effect transistor, can provide said electrical charge carriers to the ONO layer sequence in such a way that the electrical charge carriers to be detected can be at least partially stored in the silicon nitride layer of the ONO layer sequence. The charge collection electrode is preferably produced from a material having good electrical conductivity.

With the use of a charge collection electrode, it is possible to increase the detection sensitivity of the detector arrangement according to the invention. If, by way of example, in the course of a process to be characterized, charge carriers are obtained in a small quantity that can be detected only with difficulty, then said charge carriers can be accumulated by the charge collection electrode, which can be formed with a sufficiently large area, and then be provided to the ONO layer sequence. This further improves the detection sensitivity of the in any event highly sensitive ONO transistor.

Furthermore, the detector arrangement may have at least one reaction chamber that is set up in such a way that a process step for processing the substrate after fabrication of the ONO field effect transistor can be carried out in said chamber.

In particular, the reaction chamber may be set up as a plasma reaction chamber and further in particular as a plasma etching chamber for carrying out a plasma etching process. As an alternative, the plasma reaction chamber may be set up as a plasma deposition chamber for carrying out a plasma deposition process.

In the configuration of the plasma reaction chamber as a plasma etching chamber, it is possible, in the course of the plasma etching process, by way of example, to etch back or remove a layer on the surface of a substrate by forming a plasma in the plasma reaction chamber. From said plasma, excited neutral atoms or molecules (radicals) can diffuse to the substrate and react chemically with atoms on the substrate surface. This leads to an erosion or removal of a layer on the substrate if volatile reaction products are formed on account of the chemical reaction, which reaction products can be extracted for example by a vacuum pump. In such a plasma etching chamber, electrical charge carriers may be accumulated at undesired regions of the substrate (for example in a gate insulating layer), in which case such electrical charge carriers can be detected according to the invention.

In the configuration of the plasma reaction chamber as a plasma deposition chamber, by carrying out the PECVD method, for example, a layer is deposited using plasma material on the surface of the substrate, it being possible for electrical charge carriers to occur in undesired regions, for example at the gate insulating layer of a field effect transistor that is formed. Said electrical charge carriers can be detected according to the invention.

The method according to the invention for the detection of electrical charge carriers with a detector arrangement is described below. Refinements of the detector arrangement are also applicable to the method for the detection of electrical charge carriers with the detector arrangement.

In accordance with an advantageous development of the above-described method for the detection of electrical charge carriers with a detector arrangement, the threshold voltage of the ONO field effect transistor is registered as the characteristic electrical signal, and an alteration of the threshold voltage of the ONO field effect transistor is detected relative to an electrically uncharged reference field effect transistor.

As described above, the quantity and charge carrier type of electrical charge carriers that are introduced into the silicon nitride layer of an ONO layer sequence on account of a plasma process, for example, can be deduced from the alteration of the threshold voltage of the ONO field effect transistor in terms of magnitude and sign. In order to quantitatively evaluate said alteration, it is useful to know the value of the threshold voltage of the field effect transistor without electrical charge carriers introduced therein. For this purpose, a reference measurement can be carried out at a reference field effect transistor, i.e. at a field effect transistor that is not exposed to the electrical charge carriers, and the reference threshold voltage thereof can be detected. The reference field effect transistor may be an ONO field effect transistor that is different from the ONO field effect transistor. However, the reference field effect transistor may also be the ONO field effect transistor itself that is under consideration before the electrical charge carriers to be detected are introduced into it.

An exemplary embodiment of the invention is illustrated in the figures and is explained in more detail below.

A description is given below, with reference to FIG. 1A, FIG. 1B, of a detector arrangement 100 in accordance with a preferred exemplary embodiment of the invention.

Figure 1A:
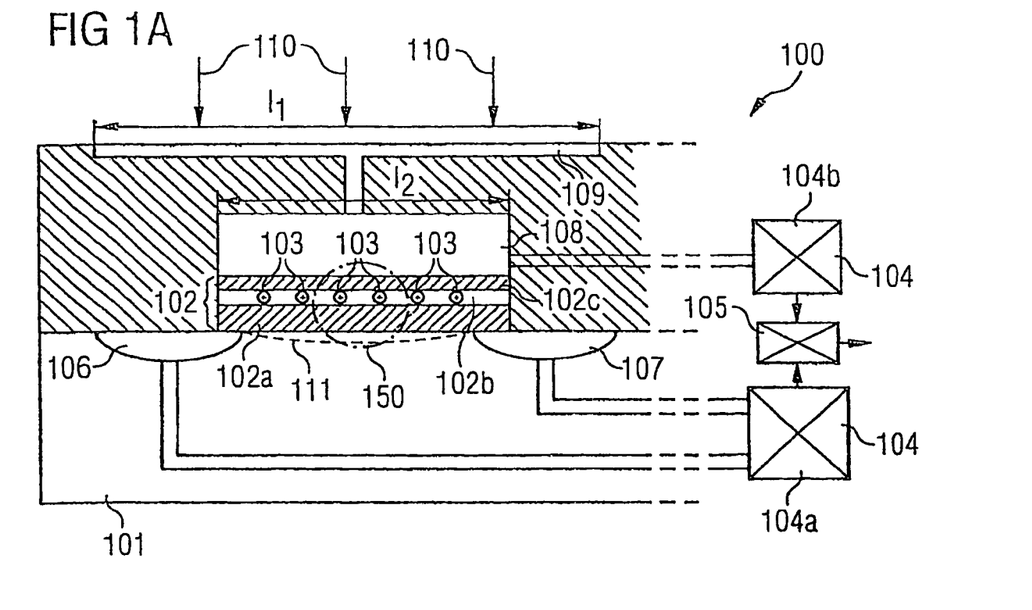
FIG. 1A shows a detector arrangement in accordance with a preferred exemplary embodiment of the invention.

The detector arrangement 100 for the detection of electrical charge carriers that is shown in FIG. 1A has an ONO field effect transistor that is formed in or on a silicon substrate 101 and is set up in such a way that the electrical charge carriers 103 to be detected can be introduced in the ONO layer sequence 102. In accordance with the exemplary embodiment described, the electrical charge carriers 103 are positively ("+") charged. Furthermore, the detector arrangement 100 has a registering unit 104 that is coupled to the ONO field effect transistor and is set up in such a way that it registers an electrical signal characteristic of the quantity and the charge carrier type (positive charge) of the electrical charge carriers 103 introduced in the ONO layer sequence 102. Furthermore, the detector arrangement 100 has a detector unit 105 for the detection of the quantity and the charge carrier type of the electrical charge carriers 103 introduced in the ONO layer sequence 102 from the characteristic electrical signal. The registering unit 104 has a first registering subunit 104a that is coupled to the two source/drain regions 106, 107 of the ONO field effect transistor and is set up in such a way that it can be used to apply a first predeterminable voltage between the two source/drain regions 106, 107 of the ONO field effect transistor, and that it registers the intensity of an electrical current flow between the two source/drain regions 106, 107. The registering unit 104 furthermore has a second registering subunit 104b that is coupled to the gate region 108 of the ONO field effect transistor and is set up in such a way that it can be used to apply a second predeterminable electrical voltage to the gate region 108 of the ONO field effect transistor. In accordance with this exemplary embodiment, the first registering subunit 104a has a voltage source for providing the first voltage and an ammeter for registering the current flow between the two source/drain regions 106, 107. The second registering subunit 104b has a voltage source that can be used to apply a variable voltage to the gate region 108 of the ONO field effect transistor. In accordance with the exemplary embodiment described, the electrical signal that is registered by the registering unit 104 and is characteristic of the quantity and the charge carrier type of the electrical charge carriers 103 introduced in the ONO layer sequence 102 is an alternation of the threshold voltage of the ONO transistor on account of the introduction of electrical charge carriers 103 into the ONO layer sequence 102. The registering unit 104 makes it possible to register a transistor characteristic curve, that is to say the dependence of the magnitude of the source/drain current on the magnitude of the gate-source voltage and therefore to register the threshold voltage of the ONO field effect transistor.

In the case of the detector arrangement 100, the two source/drain regions 106, 107 are formed as two doped surface regions of the silicon substrate 101 that are arranged at a distance from one another. The ONO layer sequence 102 is formed from a first silicon dioxide layer 102a, applied on the silicon substrate 101 between the two source/drain regions 106, 107, a silicon nitride layer 102b applied on the first silicon dioxide layer 102a, and a second silicon dioxide layer 102c applied on the silicon nitride layer 102b.

Figure 1B:
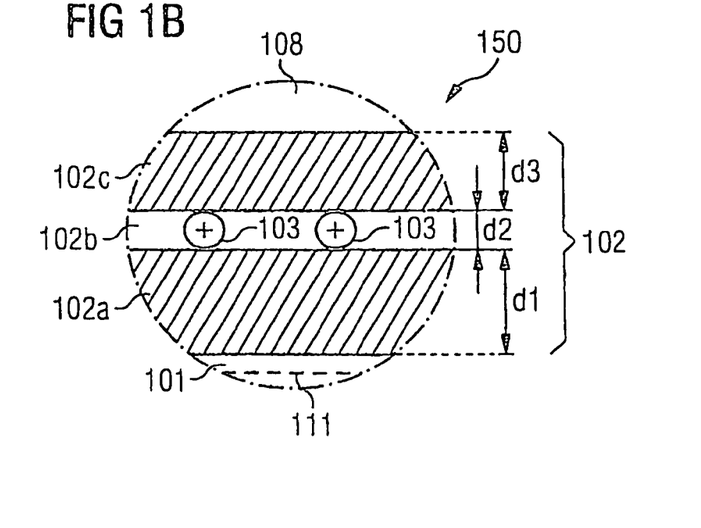
FIG. 1B shows an enlarged detail from the detector arrangement shown in FIG. 1A.

The construction of a partial region 150 of the ONO layer sequence 102 is illustrated as an enlarged view in FIG. 1b. The thickness $d_1$ of the first silicon dioxide layer 102a is 10.5 nm, the thickness of the silicon nitride layer 102b $d_2$ is 7 nm and the thickness of the second silicon dioxide layer 102c $d_3$ is 8 nm. It should be noted that the illustration in FIG. 1a, FIG. 1b is not to scale.

It should be noted that the layer thicknesses are preferably set depending on whether, in accordance with a scenario present, electrons or holes are present as charge carriers to be detected.

The gate region 108 of the ONO field effect transistor is formed as an electrically conductive layer made of polycrystalline silicon on the second silicon dioxide layer 102c.

Furthermore, the detector arrangement 100 has a charge collection electrode 109 that is coupled to the ONO layer sequence 102 via the gate region 108 and serves for accumulating electrical charge carriers 103 to be detected. The surface region of the charge collection electrode 109 is larger than the corresponding surface of the gate region 108, so that, clearly, an increased quantity of electrical charge carriers that are obtained in the course of a plasma method, for example, are accumulated on the charge collection electrode 109 and are provided to the ONO layer sequence 102 via the gate region 108 in comparison with an arrangement that does not have a charge collection electrode 109. The larger surface of the charge collection electrode 109 compared with the surface of the gate electrode 108 results from the increased horizontal extent $l_1$ of the charge collection electrode 109 in accordance with FIG. 1a compared with the horizontal extent $l_2$ of the gate electrode 108.

The arrows 110 shown in FIG. 1A illustrate how electrical charge carriers are directed onto the surface of the detector unit 100 on account of a plasma process (for example a PECVD method). It should be pointed out that the thickness $d_1$ of the first silicon dioxide layer 102a on the silicon substrate 101, with a value of 10.5 nm, is chosen to be significantly greater than the thickness of the third silicon dioxide layer 102c $d_3$ =8 nm. As discussed above, the electrical charge carriers to be detected, in accordance with FIG. 1A, are introduced from above, that is to say from the gate electrode 108 through the third silicon dioxide layer 102c into the silicon nitride layer 102b on account of the quantum mechanical tunnel effect. The tunneling current of electrical charge carriers through an electrically insulating layer decreases approximately exponentially with the thickness of the layer. The thicknesses $d_1$, $d_3$ are set such that charge carriers can only tunnel in accordance with FIG. 1B from above, that is to say proceeding from the gate region 108 through the third silicon dioxide layer 102c into the silicon nitride layer 102b, whereas an inflow or dissipation of electrical charge carriers from the source/drain regions 106, 107 through the first silicon dioxide layer 102a to the silicon nitride layer 102b is avoided on account of the thicker first silicon dioxide layer 102a.

A description is given below, with reference to the detector arrangement 100, of a method for detection of the electrical charge carriers with the detector arrangement 100.

In accordance with the method, the silicon substrate 101 is subjected to a PECVD process step in the course of which the electrical charge carriers 103 are introduced into the ONO layer sequence 102, more precisely into the silicon nitride layer 102b of the ONO layer sequence 102. Furthermore, the electrical signal characteristic of the quantity and the charge carrier type of the electrical charge carriers 103 introduced into the ONO layer sequence 102 is registered by means of the registering unit 104. In accordance with the exemplary embodiment described, the shift in the threshold voltage of the ONO field effect transistor is detected as the characteristic electrical signal using the registering unit 104. The threshold voltage of a field effect transistor is that minimum potential difference which has to be applied between a source/drain region and the gate region of the transistor in order, given a predetermined potential difference between the two source/drain regions 106, 107, to bring about an electrical current flow between the two source/drain regions 106, 107. For detection of the threshold voltage, a constant first electrical voltage is applied between the two source/drain regions 106, 107 by means of the first registering subunit 104a. A variable second electrical voltage is applied to the gate region 108 by means of the second registering subunit 104b. The intensity of a possible electrical current flow between the two source/drain regions 106, 107 is detected by means of an ammeter of the first registering subunit 104a. In other words, given a predetermined source/drain voltage (first electrical voltage), the electrical current between the two source/drain regions 106, 107 is registered in a manner dependent on the altered second voltage at the gate region (that is to say in a manner dependent on a variable gate-source voltage). A transistor characteristic curve is obtained as a result, and the threshold voltage of the ONO field effect transistor can be determined from said characteristic curve. Thus, the threshold voltage of the ONO field effect transistor is registered as the characteristic electrical signal. More precisely, an alternation of the threshold voltage of the ONO field effect transistor is detected, relative to an electrically uncharged reference field effect transistor. That is to say that the threshold voltage of the ONO field effect transistor of the detector arrangement 100 is first of all registered in the case of a scenario that deviates from FIG. 1A and in the case of which the ONO layer sequence 102 is free of electrical charge carriers 103 (reference threshold voltage). Then, in accordance with the scenario shown in FIG. 1A, the threshold voltage of the ONO field effect transistor is registered in the state in which the electrical charge carriers 103 are introduced in the ONO field effect transistor of the detector arrangement 100 from FIG. 1A. From the difference in the threshold voltage in both states, the quantity and the charge carrier type of the electrical charge carriers 103 introduced in the ONO layer sequence 102 are detected by means of the functionality of the detector unit 105. Said functionality may for example consist in the detector unit assigning a charge quantity to a registered threshold voltage shift from a table of values contained in said detector unit. Such a table of values may be obtained for example from a previous calibration.

A description is given below of how the threshold voltage of the ONO field effect transistor is altered by the introduction of electrical charge carriers into the silicon nitride layer 102b of the ONO layer sequence 102. With reference to FIG. 1A, positively charged electrical charge carriers from a plasma process are directed onto the charge collection electrode 109, said electrical charge carriers 109 being provided to the gate region 108 by the charge collection electrode 109. As a result, electrically positive charge carriers 103 are incorporated in the silicon nitride layer 102b, as shown in FIG. 1A, FIG. 1B. The positively charged charge carriers 103 in the silicon nitride layer 102b have the same effect as a positive gate voltage at the gate electrode 109. This means that the positively charged electrical charge carriers 103, like a positive gate bias voltage, generate an electric field which characteristically alters the conductivity of the channel region 111. The threshold voltage of the transistor is altered by a contribution generated by the electrical charge carriers 103, depending on the quantity and the sign of the charge carriers. The second registering subunit 104b then has to apply an electrical voltage altered by said contribution to the gate region 106 in order to make the n-MOS transistor conductive. Depending on the sign of the electrical charge of the charge carrier type, the electrical charge carriers 103 bring about a positive or negative shielding effect, i.e. an amplification or attenuation of the electric field generated by a voltage applied externally to the gate region. Clearly, the ONO field effect transistor is biased on account of the charge carriers 103.

In a complementary scenario in which electrically negatively charged charge carriers (e.g. electrons) are introduced in the silicon nitride layer 102b, the electrons, in the silicon nitride layer 102b of the ONO layer sequence 102, generate an electric field with an opposite sign compared with the scenario described above (holes in the ONO layer sequence). When a positive voltage is applied to the gate region, it is attenuated by the electric field of the electrons. In other words, the negative bias voltage generated by the electrons partially compensates for the external positive gate voltage in its effect on the conductivity of the channel region, so that a depletion of charge carriers in the channel region is the consequence. The electric field generated by the external voltage experiences an attenuation as a result of this shielding effect. This results in a characteristic alteration of the threshold voltage. The second registering subunit 104b has to apply to the gate region 108 a second electrical voltage increased by a corresponding contribution in order to bring the channel region 111 between the two source/drain regions 106, 107 into a conductive state. In this case, the threshold voltage is increased on account of the introduction of negatively charged charge carriers into the ONO layer sequence 102. In this way, an increase or a reduction of the threshold voltage can be unambiguously related to the sign of the electrical charge of the electrical charge carriers 103.

A description is given below, with reference to FIG. 2, of the physical relationship between the introduction of electrical charge carriers into the ONO layer sequence of the ONO field effect transistor and the alteration of the threshold voltage of the ONO field effect transistor $\Delta V_{th}$.

Figure 2:
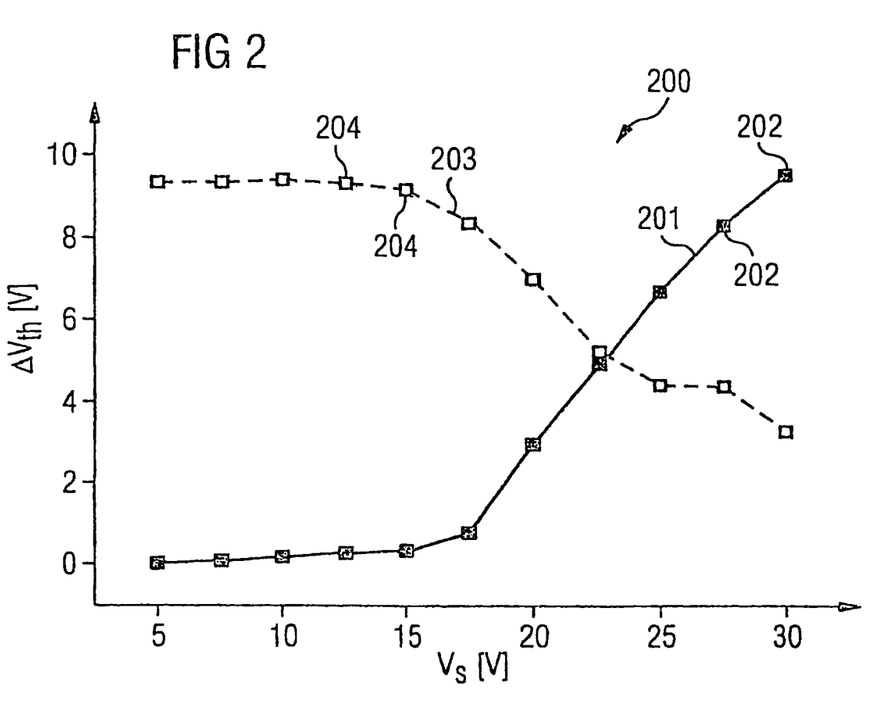
FIG. 2 shows a diagram showing the dependence of the alteration of the threshold voltage of an ONO field effect transistor of a detector arrangement on the stress voltage on account of electrical charge carriers acting on the ONO field effect transistor.

The diagram 200 shown in FIG. 2 shows the alteration of the threshold voltage of an ONO field effect transistor $\Delta V_{th}$ (in volts) as a function of a "stress voltage" $V_s$ (in volts) as was obtained for an ONO field effect transistor. The stress voltage $V_s$ is the electrical voltage on account of the introduction of electrical charge carriers into the ONO layer sequence. Such charge carriers physically have the same effect as an additional voltage applied to the gate region of the ONO field effect transistor.

FIG. 2 shows a first curve 201 obtained from a connection of data points 202. Furthermore, FIG. 2 shows a second curve 203 obtained from a connection of data points 204. Curve 201 corresponds to the scenario in which charge carriers (stress voltage) are introduced into the ONO layer, so that the threshold voltage increases at a sufficiently high stress voltage. The values obtained correspond to a stress pulse for a time of five seconds. As can be seen from the curves 201, 203, the threshold voltage $\Delta V_{th}$ is altered greatly starting from a minimum stress loading (approximately 15 V) of the ONO field effect transistor. Curve 203 corresponds to the scenario in which (at $V_s$=0 V) the silicon nitride layer already contains charge carriers, which are removed (clearly "erased") from the silicon nitride layer by application of a corresponding stress voltage. As shown in FIG. 2, approximately the same voltage in terms of magnitude is necessary for the removal of the charge carriers as for the introduction.

The following publications are cited in this document:

[1] Lukaszek, W, Reno, S, Bammi, R (1996) "Influence of Photoresist on Wafer Charging During High Current Arsenic Implant" XI International Conference on Ion Implantation Technology, Jun. 16-21, 1996, Austin, Tex.
[2] Eitan, B, Pavan, P, Bloom, I, Aloni, E, Frommer, A, Finzi, D (2000) "NROM: A Novel Localized Trapping, 2-Bit Nonvolatile Memory Cell" IEEE Electron Device Letters 21(11):543-545
[4] U.S. Pat. No. 5,457,336
[5] U.S. Pat. No. 5,768,192
[6] U.S. Pat. No. 5,594,328
[7] EP 1,061,580 A2

LIST OF REFERENCE SYMBOLS

100 Detector arrangement
101 Silicon substrate
102 ONO layer sequence
102a First silicon dioxide layer
102b Silicon nitride layer
102c Second silicon dioxide layer
103 Electrical charge carriers
104 Registering unit
104a First registering subunit
104b Second registering subunit
105 Detector unit
106 First source/drain region
107 Second source/drain region
108 Gate region
109 Charge collection electrode
110 Arrows
111 Channel region
150 Partial region
200 Diagram
201 First curve
202 Data points
203 Second curve
204 Data points

The invention claimed is:

1. A detector arrangement for the detection of electrical charge carriers having an ONO field effect transistor that is formed in and/or on a substrate and is set up in such a way that the electrical charge carriers to be detected can be introduced in the ONO layer sequence;
having a registering unit that is coupled to the ONO field effect transistor and is set up in such a way that it registers an electrical signal characteristic of the quantity and/or the charge carrier type of the electrical charge carriers introduced in the ONO layer sequence;
having a detector unit for the detection of the quantity and/or the charge carrier type of the electrical charge carriers introduced in the ONO layer sequence from the characteristic electrical signal;
having at least one reaction chamber that is set up in such a way that a process step for processing the substrate after fabrication of the ONO field effect transistor can be carried out in said chamber;
in which the registering unit has a first registering subunit that is coupled to the two source/drain regions of the ONO field effect transistor and is set up in such a way that
it can be used to apply a first predeterminable voltage between the two source/drain regions of the ONO field effect transistor; and
it registers the intensity of an electrical current flow between the two source/drain regions.

2. The detector arrangement as claimed in claim 1, in which the registering unit has a second registering subunit that is coupled to the gate region of the ONO field effect transistor and is set up in such a way that it can be used to apply a second predeterminable electrical voltage to the gate region of the ONO field effect transistor.

3. The detector arrangement as claimed in one of claims 1 or 2, in which the electrical signal that is registered by the registering unit and is characteristic of the quantity and/or the charge carrier type of the electrical charge carriers introduced in the ONO layer sequence is an alteration of the threshold voltage of the ONO field effect transistor on account of the introduction of electrical charge carriers into the ONO layer sequence.

4. The detector arrangement as claimed in one of claims 1 or 2, in which, in the ONO field effect transistor,
the two source/drain regions are formed as two doped surface regions of the substrate arranged at a distance from one another;
the ONO layer sequence is formed from a first silicon dioxide layer on the substrate between the two source/drain regions, a silicon nitride layer on the first silicon dioxide layer and a second silicon dioxide layer on the silicon nitride layer;
the gate region is formed as an electrically conductive layer on the second silicon dioxide layer.

5. The detector arrangement as claimed in one of claims 1 or 2, having a charge collection electrode that is coupled to the ONO layer sequence via the gate region and serves for accumulating electrical charge carriers to be detected and for providing the charge carriers to be detected to the ONO layer sequence.

6. The detector arrangement as claimed in claim 1 in which the reaction chamber is set up as a plasma reaction chamber for carrying out a plasma process.

7. The detector arrangement as claimed in claim 6, in which the plasma reaction chamber is set up as a plasma etching chamber for carrying out a plasma etching process.

8. Thee detector arrangement as claimed in claim 6, on which the plasma reaction chamber is set up as a plasma deposition chamber for carrying out a plasma deposition process.

9. A method for the detection of electrical charge carriers with a detector arrangement having an ONO field effect transistor that is formed in and/or on a substrate and is set up in such a way that the electrical charge carriers to be detected can be introduced in the ONO layer sequence;
having a registering unit that is coupled to the ONO field effect transistor and is set up in such a way that it registers a characteristic electrical signal that is characteristic of the quantity and/or the charge carrier type of the electrical charge carriers introduced in the ONO layer sequence;
having a detector unit for the detection of the quantity and/or the charge carrier type of the electrical charge carriers introduced in the ONO layer sequence from the characteristic electrical signal;

having at least one reaction chamber that is set up in such a way that a process step for processing the substrate after fabrication of the ONO field effect transistor can be carried out in said chamber;

in which case, in accordance with the method, the substrate is subjected to a process step in which electrical charge carriers are introduced into the ONO layer sequence of the ONO field effect transistor;

the characteristic electrical signal that is characteristic of the quantity and/or the charge carrier type of the electrical charge carriers introduced in the ONO layer sequence is registered by means of the registering unit;

the quantity and/or the charge carrier type of the electrical charge carriers introduced in the ONO layer sequence is detected from the characteristic electrical signal by means of the detector unit the threshold voltage of the ONO field effect transistor is registered as the characteristic electrical signal;

an alteration of the threshold voltage of the ONO field effect transistor is detected relative to an electrically uncharged reference field effect transistor.

* * * * *